United States Patent
Asayama et al.

(10) Patent No.: US 6,709,957 B2
(45) Date of Patent: Mar. 23, 2004

(54) METHOD OF PRODUCING EPITAXIAL WAFERS

(75) Inventors: Eiichi Asayama, Tokyo (JP); Yasuo Koike, Tokyo (JP); Tadami Tanaka, Tokyo (JP); Toshiaki Ono, Tokyo (JP); Masataka Horai, Tokyo (JP); Hideshi Nishikawa, Tokyo (JP)

(73) Assignee: Sumitomo Mitsubishi Silicon Corporation, Tokyo (JP)

( * ) Notice: Subject to any disclaimer, the term of this patent is extended or adjusted under 35 U.S.C. 154(b) by 0 days.

(21) Appl. No.: 10/173,099

(22) Filed: Jun. 18, 2002

(65) Prior Publication Data

US 2003/0008447 A1 Jan. 9, 2003

(30) Foreign Application Priority Data

Jun. 19, 2001 (JP) ........................................ 2001-184185

(51) Int. Cl.$^7$ ............................................. H01L 21/36
(52) U.S. Cl. ........................ 438/509; 438/200; 438/487; 438/765
(58) Field of Search .......................... 438/509, 200, 438/268, 487, 765, 503; 428/446

(56) References Cited

U.S. PATENT DOCUMENTS 6,143,071 A * 11/2000 Aihara et al. ................. 117/89

2002/0142171 A1 * 10/2002 Asayama et al. ........... 428/446

FOREIGN PATENT DOCUMENTS

| JP | 11-189493 | 7/1999 |
| JP | 2000-044389 | 2/2000 |

* cited by examiner

Primary Examiner—Dung Le
(74) Attorney, Agent, or Firm—Clark & Brody

(57) ABSTRACT

The invention relates to a method of producing epitaxial wafers for the manufacture of high integration density devices capable of showing stable gettering effect. Specifically, it provides (1) a method of producing epitaxial wafers which comprises subjecting a silicon wafer sliced from a single crystal ingot grown by doping with not less than $1\times10^{13}$ atoms/cm$^3$ of nitrogen to 15 minutes to 4 hours of heat treatment at a temperature not lower than 700° C. but lower than 900° C. and then to epitaxial growth treatment. It is desirable that the above single crystal ingot have an oxygen concentration of not less than $11\times10^{17}$ atoms/cm$^3$. Further, (2) the above heat treatment is desirably carried out prior to the step of mirror polishing of silicon wafers. Furthermore, (3) it is desirable that the pulling rate be not increased in starting tail formation as compared with the pulling rate of the body in growing the above single crystal ingot. By taking these means, it is possible to produce epitaxial wafers having an almost constant, high level of gettering effect irrespective of the site of wafer slicing from the single crystal ingot and, furthermore, suppress the occurrence of defects within the epitaxial layer.

10 Claims, 1 Drawing Sheet

METHOD OF PRODUCING EPITAXIAL WAFERS

FIELD OF THE INVENTION

The present invention relates to a method of producing epitaxial wafers exhibiting high gettering effect by doping a silicon single crystal with nitrogen in the process of growing thereof, slicing silicon wafers from the thus-grown single crystal ingot, subjecting the wafers obtained to predetermined heat treatment and then treating them for epitaxial growth.

DESCRIPTION OF THE PRIOR ART

In recent years, the tendency toward higher degree of integration of silicon W semiconductor integrated circuit devices has been rapidly increasing and, accordingly, silicon wafers on which devices are formed have been subjected to increasingly severe quality standards. Thus, since circuits become finer or thinner with the increase in integration density, crystal defects, such as dislocations, and metal element impurities other than a dopant in the so-called device active region where devices are formed on a wafer are subjected to more rigorous limitations than ever before, for such defects and impurities will cause increases in leakage current and/or shorten the life of a carrier.

In the prior art, a wafer sliced from a silicon single crystal obtained by the Czochralski method (hereinafter referred to as "CZ method" and such wafer as "CZ wafer") is used in producing a semiconductor device. This wafer generally contains interstitial oxygen at a supersaturated concentration of about $10^{18}$ atoms/cm$^3$. While oxygen is effective in preventing the occurrence of dislocations and thereby enhancing the silicon wafer strength and in providing a gettering effect, it is well known that oxygen deposits in an oxide form and thus induce crystal defects such as dislocations and/or stacking faults upon heating during device production.

Meanwhile, in the process of device production, the wafer is maintained at a temperature as high as 1,100 to 1,200° C. for several hours for the formation of a field oxide film by LOCOS (local oxidation of silicon) or the formation of a well diffusion layer and, as a result, a defect-free denuded zone with a thickness of about several tens of micrometers is formed near the wafer surface owing to diffusion of interstitial oxygen to the outside. This denuded zone serves as a device active region and a condition with reduced crystal defects is thus provided.

However, the employment of the high-energy ion implantation method for well formation and a temperature of not higher than 1,000° C. for device production in conjunction with device miniaturization corresponding to the increasing density of integration makes it difficult to allow the above-mentioned oxygen diffusion to a sufficient extent and thereby form a denuded zone in the vicinity of the surface. Thus, attempts have been made to reduce the oxygen content in the wafer. However, the formation of crystal defects cannot be suppressed to a satisfactory extent but oxygen reduction rather causes deterioration in wafer performance characteristics; no satisfactory results have thus been obtained. Therefore, an epitaxial wafer produced by allowing an epitaxial Si layer substantially free of crystal defects to grow on a silicon wafer has been developed and is widely used in producing a high integration density device.

However, even when an epitaxial wafer highly perfect as a crystal is used, the chance of contamination of the epitaxial layer by metal element impurities in the process of device production increases and the influence thereof also increases since the device process becomes complicated with the increasing degree of integration.

To cope with this contamination problem, there is the technique of gettering. This is the technique comprising collecting or capturing contaminant impurity elements at sites (sinks) outside the device active region to thereby avoid their adverse effects. One gettering technology is the so-called intrinsic gettering (IG) which uses oxygen-induced crystal defects (bulk micro defects; BMDs) induced during heat treatment in the device process as sinks.

In the case of an epitaxial wafer, however, the temperature reaches a level as high as 1,050 to 1,200° C. in the step of epitaxial layer formation, so that oxygen precipitates to serve as nuclei of micro defects in the wafer reduce in size or disappear. It is thus difficult to induce a sufficient number of BMDs to serve as sources of gettering in the wafer in the subsequent device process. In particular when the device process is carried out at a lower temperature, as mentioned above, the growth of oxygen precipitates becomes slow and a problem arises in that no sufficient gettering effect upon metal impurities can be expected not only in the initial stage of the device process but also throughout the device process.

Therefore, extrinsic gettering (EG) has been used combinedly as an alternative gettering method. This method comprises introducing crystal defects by causing distortion by means of extrinsic factors such as sandblasting, grinding, laser irradiation, ion implantation, and growth of a $Si_3N_4$ or polycrystalline Si film on that side of the wafer which is reverse to the side on which devices are formed. The combined use of the EG method causes not only the increased cost problem due to the increase in the number of steps but also such problems as particle generation resulting from detachment of silicon fragments from the distorted layer and deterioration in flatness due to the growth of a polycrystalline silicon film.

To overcome the above problems, a method has been proposed which does not depend on the combined use of EG but improves the IG capacity itself by doping with an impurity capable of promoting oxygen precipitation in the step of single crystal growth. For example, Japanese Patent Application Laid-Open No. 11-189493 proposes a method which selects nitrogen as the element to promote oxygen precipitation and thus provide gettering effect and according to which the doping is carried out to a nitrogen concentration of not less than $1 \times 10^{13}$ atoms/cm$^3$ to thereby form, within the wafer, stable precipitates which will hardly disappear even in the epitaxial step involving high temperature treatment.

However, when nitrogen doping is carried out to a specified concentration of not less than $1 \times 10^{13}$ atoms/cm$^3$ according to the proposed method, nitrogen segregation occurs from the top to the tail of the single crystal ingot grown and thus the nitrogen concentration varies all over the whole length of the single crystal ingot. The BMD density, which influences the gettering effect, varies accordingly, hence no uniform gettering effect can be expected from the top to the tail of the single crystal ingot.

Further, Japanese Patent Application Laid-Open No. 2000-044389 proposes a method of increasing the gettering effect which comprises using a CZ wafer doped with $1 \times 10^{10}$ to $5 \times 10^{15}$ atoms/cm$^3$ of nitrogen and subjecting the same, before epitaxial growth treatment, to heat treatment at a temperature not lower than 900° C. but not higher than the melting point of silicon, desirably 1,100° C. to 1,250° C.

Allegedly, this method can suppress the formation of defects within the epitaxial layer and can bring about a gettering effect. However, even this proposed method does not take into consideration the nitrogen segregation occurring from the top to the tail of the single crystal ingot grown, and it is difficult, by this method, to obtain a uniform gettering effect all over the single crystal ingot.

SUMMARY OF THE INVENTION

The present invention has been made in view of the problem that epitaxial wafers differ in gettering effect depending on the site of slicing from a single crystal ingot owing to nitrogen segregation on the occasion of growth by the CZ method. Thus, it is an object of the present invention to provide a method of producing epitaxial wafers having an equal and high level of gettering effect irrespective of the site of slicing from a single crystal ingot while suppressing the formation of defects in the epitaxial layer.

Among micro defects of a crystal which are caused by a content of oxygen, there are oxidation-induced stacking faults (hereinafter referred to as "OSFs" for short). These are stacking faults appearing in the substrate crystal covered with oxide film in the step of high-temperature thermal oxidation treatment during the device production process.

As mentioned above, a single crystal ingot grown by the CZ method contains oxygen and, therefore, when a wafer sliced therefrom is subjected to 1 to 20 hours of thermal oxidation treatment at 1,000 to 1,200° C., ring likely distributed oxidation-induced stacking faults (hereinafter referred to as "OSF ring") may occur on the crystal surface of the wafer in certain instances.

The OSFs are induced by the above-mentioned thermal oxidation treatment at 1,000 to 1,200° C. with stable oxygen precipitates, which hardly disappear even at a high temperature of 1,200° C. or above, serving as nuclei. The ring-like region within the wafer surface where OSFs are supposed to appear when such thermal oxidation treatment is carried out is herein referred to as a "potential OSF ring". When an epitaxial layer of Si is formed on the wafer surface including this potential OSF ring, the oxygen precipitate nuclei will not disappear but form BMDs in the device process after epitaxial layer formation, whereby an effective gettering effect is produced.

The OSF ring generally has a width of several millimeters to scores of millimeters, and the width of the OSF ring can be increased by nitrogen doping in the step of single crystal growth. Wafers sliced from this single crystal ingot show good gettering effect.

However, the density of oxygen precipitates, which serve as nuclei for OSFs, depends on the nitrogen concentration. Further, nitrogen is introduced into the single crystal ingot from the melt according to the segregation coefficient. Therefore, the nitrogen concentration differs between the top and tail of the ingot, hence the BMD density varies accordingly. In other words, in the single crystal ingot, the nitrogen concentration increases from the top toward the tail and the gettering effect varies accordingly. Thus, the gettering effect differs depending on the site of wafer slicing from the single crystal ingot.

When a CZ wafer is used, the growth of small precipitation nuclei can be promoted by subjecting the wafer to heat treatment at a temperature of not lower than 700° C. but lower than 900° C. prior to epitaxial growth treatment. Therefore, even such precipitation nuclei that may disappear upon high-temperature epitaxial growth treatment without this heat treatment can be grown by this heat treatment and, thereby, the density of precipitation nuclei which will not disappear upon epitaxial growth treatment but remain can be increased.

When this heat treatment is carried out, it is desirably carried out before the step of mirror polishing of wafers to be subjected to epitaxial treatment so that surface flaws appearing upon heat treatment, for example flaws caused by a wafer boat for supporting a wafer to be subjected to heat treatment, may not remain.

The heat treatment carried out prior to epitaxial growth treatment is intended to form oxygen precipitates which hardly disappear even in the epitaxial step. However, when the heat treatment time is longer than 4 hours, the growth of stacking faults may extend into the epitaxial layer, leading to a tendency toward formation of defects in the epitaxial layer. Therefore, it is desirable that the heat treatment time be not longer than 4 hours.

During the heat treatment, contamination may occur from the furnace. For preventing such wafer contamination, it is effective to form an oxide film as a protective film on the wafer. Thus, a mixed atmosphere composed of oxygen and an inert gas is desirably used as the atmosphere in carrying out the heat treatment. This mixture of oxygen gas in atmosphere only at wafer loading is also effective for the formation of oxide film.

When the above heat treatment is carried out prior to the step of mirror polishing of wafers, the oxide film formed on the wafer surface can be removed in the mirror polishing step. Therefore, it is not necessary to employ a particular step of removing the oxide film, for example a step of removing the oxide film with hydrofluoric acid (HF).

When the heat treatment prior to epitaxial growth treatment is carried out at a temperature in the vicinity of 900° C., which is the upper limit, the BMD density in the body portion near the tail of the single crystal ingot becomes lower as compared with the other portions. This is caused by the fact that, in the conventional CZ method, when tailing is started, the pulling rate of the single crystal ingot is increased to 1.1 to 1.3 times the pulling rate of the body.

Thus, the body portion followed by the tail is cooled rapidly upon increasing the pulling rate. In the corresponding body portion, the time for the passage of the temperature range of 1,050° C. to 700° C. in which oxygen precipitation nuclei are formed is shortened as compared with the other body portions, whereby the formation of oxygen precipitation nuclei is inhibited.

The tail of a single crystal ingot can also be formed by carrying out tailing while raising the melt temperature, not by controlling the pulling rate. Thus, when the pulling rate of the single crystal ingot is not increased in starting tail formation but the tail formation is effected by raising the melt temperature, the number of oxygen precipitates can be increased and the BMD density can be leveled in the body portion close to the tail as well.

The above findings have led to completion of the present invention, which is directed to the methods of producing epitaxial wafers as specified below.

(1) A method of producing epitaxial wafers which comprises subjecting a silicon wafer sliced from a single crystal ingot grown by doping with not less than $1 \times 10^{13}$ atoms/$cm^3$ of nitrogen to 15 minutes to 4 hours of heat treatment at a temperature not lower than 700° C. but lower than 900° C. and then to epitaxial growth treatment.

It is desirable that the above single crystal ingot have an oxygen concentration of not less than $11 \times 10^{17}$ atoms/$cm^3$.

(2) In the above production method (1), the heat treatment is desirably carried out prior to the step of mirror polishing of wafers. Furthermore, a mixed atmosphere composed of oxygen and an inert gas is desirably used as the atmosphere in this heat treatment. As an inert gas, nitrogen gas or argon gas is desirable.

(3) In growing the above single crystal ingot, it is desirable that the pulling rate be not increased in starting tail formation as compared with the pulling rate of the body. Furthermore, it is desirable that, in the body portion from the boundary between the body and tail of the single crystal ingot to 200 mm above the boundary, the cooling rate from 1,050° C. to 700° C. be not higher than 2.5° C./minute.

DESCRIPTION OF PREFERRED EMBODIMENTS

Figure 1:
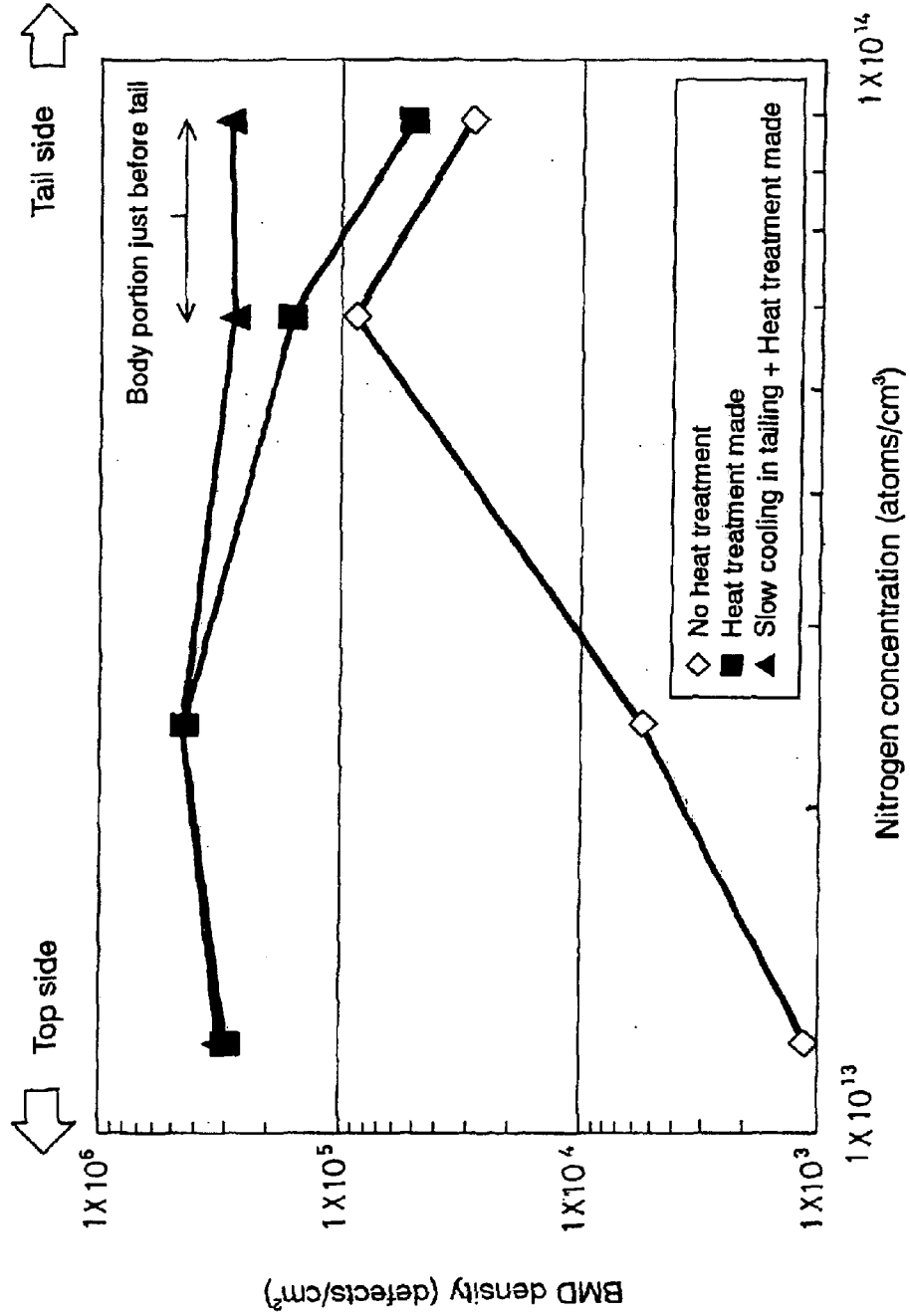
FIG. 1 is a graphic representation of the relationship between the nitrogen concentration in epitaxial wafers originating from different sites of the body of a single crystal ingot and the BMD density in the wafer cross-section after heat treatment for evaluation.

In cases where a silicon single crystal is doped with nitrogen alone, the level of nitrogen doping is not less than $1 \times 10^{13}$ atoms/cm$^3$. This is because the expansion of the OSF ring width is insufficient and no uniform gettering effect distribution within wafers can be obtained at lower nitrogen levels. The upper limit to the doping level is not particularly restricted but desirable is up to about $4.5 \times 10^{15}$ atoms/cm$^3$, since higher levels may lead to a polycrystalline ingot.

The method of doping may be any one provided that nitrogen doping can be realized to a necessary concentration. As for the method of nitrogen doping which has so far been applied particularly rarely, there may be mentioned, for example, the admixture of a nitride with the raw material or melt, admixture of a silicon crystal produced by the nitrogen-added floating zone (FZ) method or wafers having a silicon nitride film formed on the surface with the raw material, single crystal growth while passing nitrogen or a nitrogen compound gas through the furnace, blowing of nitrogen or a nitrogen compound gas against polycrystalline silicon at a high temperature prior to melting, and use of a nitride crucible.

The nitrogen-doped single crystal is sliced, the wafer surface is polished and cleaned, and an epitaxial layer is formed on the surface to give epitaxial wafers. The method of epitaxial layer formation may be any of known methods capable of forming a crystal defect-free epitaxial layer, for example the thermal decomposition method such as the gaseous phase growth method.

EXAMPLES

The effects of the present invention are made clear referring to Examples 1 and 2.

Example 1

A p type (100) single crystal ingot having a body diameter of 200 mm and an oxygen concentration of $13 \times 10^{17}$ atoms/cm$^3$ (old ASTM, 1976) with a resistivity of 0.1 Ωcm was grown from a nitrogen-doped raw material silicon melt (100 kg) by the CZ method. CZ wafers were sliced from different sites of the single crystal ingot, and the thus-obtained CZ wafers were mirror-polished and either directly subjected to epitaxial growth treatment or subjected, after mirror polishing, to heat treatment at 880° C. for 1 hour in a mixed atmosphere composed of oxygen and nitrogen with volume fraction of 0.3 to 9.7 and then to epitaxial growth treatment.

For the case of epitaxial growth treatment following 1 hour of heat treatment at 880° C., the formation of the tail of the single crystal ingot was carried out in two ways. One way was that tail formation was done mainly by increasing the pulling rate. Another way was that tail formation was done by raising melt temperature, not by increasing the pulling rate.

The epitaxial growth treatment was carried out using an individual type epitaxial growth system (Advanced Semiconductor Materials (ASM) model Epsilon) at a deposition temperature of 1,150° C. to thereby cause an about 5 μm-thick epitaxial layer to grow on the wafer surface. The epitaxial wafers obtained were subjected to heat treatment for evaluation in an oxygen atmosphere at 1,000° C. for 16 hours in simulation of the thermal history in the conventional device process. The cross section of each wafer was selectively etched with the Wright etching solution for 5 minutes and measured for BMD density under an optical microscope.

FIG. 1 is a graphic representation of the relationship between the nitrogen concentration in epitaxial wafers originating from different sites of the body of the single crystal ingot and the BMD density in the wafer cross-section after heat treatment for evaluation. With the wafers obtained by subjecting the CZ wafers directly to epitaxial growth treatment, the BMD density increased with the increase in nitrogen concentration. This increase in BMD density, which is due to the increase in the concentration of nitrogen introduced into the wafer from the top toward the tail of the single crystal ingot, indicates that the gettering effect of the epitaxial wafer varies depending on the site of slicing from the single crystal ingot.

On the contrary, with the wafers subjected to 1 hour of heat treatment at 880° C. prior to epitaxial growth treatment, those originating from the top portion of the single crystal ingot showed increased BMD densities higher than $1 \times 10^5$ defects/cm$^2$, indicating that the gettering effect was at a high level all over the whole length of the single crystal ingot.

To have such gettering effect is effective in devices required to have a high level of gettering effect from the initial stage of the device process. Moreover, epitaxial wafers having a constant level of gettering effect can be obtained by carrying out heat treatment at 880° C. for 1 hour prior to epitaxial growth treatment irrespective of the site of excision from the single crystal ingot.

Furthermore, when a comparison is made with respect to the BMD density in the body portion in the vicinity of the tail, the decrease in BMD density is much more remarkable in the case where CZ wafers were directly subjected to epitaxial growth treatment. Even when epitaxial growth treatment was carried out after 1 hour of heat treatment at 880° C., a decrease in BMD density was observed in the body portion close to the tail in the case where the pulling rate in single crystal ingot tail formation was larger than that in the body formation. It was found that such decrease in BMD density is observable in the body range from the boundary between the body and tail to 200 mm above that boundary.

A comparison was made with respect to the cooling rate of the body portion close to the tail. When the pulling rate in single crystal ingot tail formation was the same as the pulling rate of the body and the tail formation was carried out by raising the melt temperature, the cooling rate was 2.50/min from 1050° C. to 700° C., while the cooling rate was 3.0/min when this treatment was not carried out. For leveling the BMD density in the body portion close to the tail, it is desirable to carry out the tail formation by elevating the melt temperature.

Example 2

In Example 2, CZ wafers having a nitrogen concentration of $2\times10^{13}$ atoms/cm$^3$ and an oxygen concentration selected from among 3 levels ($11\times10^{17}$ atoms/cm$^3$, $13\times10^{17}$ atoms/cm$^3$, and $15\times10^{17}$ atoms/cm$^3$, old ASTM, 1976) were used. The wafers obtained were subjected to 1 hour of heat treatment in the temperature range of 600° C. to 1,100° C. for 0.5 to 4 hours followed by mirror-polishing and then subjected to epitaxial growth treatment under the same conditions as in Example 1. The epitaxial wafers obtained were subjected to heat treatment for evaluation in an oxygen atmosphere at 1000° C. for 16 hours. The cross section of each wafer was selective etched with the Wright etching solution for 5 minutes and measured for BMD density with an optical microscope.

Further, the occurrence of defects not smaller than 0.09 μm in size in each epitaxial layer was examined using a commercial plane defect inspector (Tenchor model SP1) and expressed in terms of defect density. The production conditions and evaluation results in Example 2 are shown in Table 1.

A comparison made with respect to the heat treatment time based on the results shown in Table 1 revealed the following. For the wafers heat treated at 880° C. for 0.5 hour (Examples 1 to 3 according to the invention), almost no increase in BMD density is observable when the oxygen concentration is $11\times10^{17}$ atoms/cm$^3$ (Example 1) whereas, for the wafers heat-treated at 880° C. for 1.0 hour (Examples 4 to 6 according to the invention), the BMD density is not less than $10^5$ defects/cm$^2$ even when the oxygen concentration is low, namely $11\times10^{17}$ atoms/cm$^3$ (Example 4).

The epitaxial layer defect density increased with the oxygen concentration and heat treatment time, indicating that it is not desirable to select such a high oxygen concentration as $15\times10^{17}$ atoms/cm$^3$.

Further, when the time of heat treatment at 880° C. was 4 hours (Examples 7 to 9), the epitaxial layer defect density rapidly increased, suggesting that it is desirable to select a treatment time shorter than 4 hours. When the heat treatment temperature was 600° C. or below (Examples 10 to 12), the BMD density did not increase whereas, when the heat treatment was carried out at 700° C. for 4 hours (Examples 13 to 15), a BMD density of 3 to $7\times10^4$ defects/cm$^2$ was obtained.

On the other hand, when the heat treatment temperature was as high as 1,100° C. (Examples 16 to 18), the precipitate density did not increase. Therefore, it is desirable that the heat treatment prior to epitaxial growth treatment be carried

TABLE 1

| | Oxygen concentration ($\times10^{17}$ atoms/cm$^3$) | Heat treatment temperature (° C.) | Heat treatment time (hour) | BMD density (defects/cm$^2$) | Epitaxial defect density (defects/cm$^2$) |
|---|---|---|---|---|---|
| Comparative Example | 13 | None | None | $3 \times 10^3$ | 0.07 |
| Examples of the Invention 1 | 11 | 880 | 0.5 | $4 \times 10^3$ | 0.09 |
| Examples of the Invention 2 | 13 | 880 | 0.5 | $2 \times 10^5$ | 0.11 |
| Examples of the Invention 3 | 15 | 880 | 0.5 | $3 \times 10^5$ | 0.18 |
| Examples of the Invention 4 | 11 | 880 | 1 | $2 \times 10^5$ | 0.12 |
| Examples of the Invention 5 | 13 | 880 | 1 | $3 \times 10^5$ | 0.13 |
| Examples of the Invention 6 | 15 | 880 | 1 | $3.5 \times 10^5$ | 0.19 |
| Examples of the Invention 7 | 11 | 880 | 4 | $2.2 \times 10^5$ | 0.3 |
| Examples of the Invention 8 | 13 | 880 | 4 | $4 \times 10^5$ | 0.34 |
| Examples of the Invention 9 | 15 | 880 | 4 | $4.4 \times 10^5$ | 0.45 |
| Examples of the Invention 10 | 11 | 600 | 4 | $3.4 \times 10^3$ | 0.1 |
| Examples of the Invention 11 | 13 | 600 | 4 | $4 \times 10^3$ | 0.11 |
| Examples of the Invention 12 | 15 | 600 | 4 | $4.2 \times 10^3$ | 0.12 |
| Examples of the Invention 13 | 11 | 700 | 4 | $3 \times 10^4$ | 0.12 |
| Examples of the Invention 14 | 13 | 700 | 4 | $5 \times 10^4$ | 0.12 |
| Examples of the Invention 15 | 15 | 700 | 4 | $7 \times 10^4$ | 0.13 |
| Examples of the Invention 16 | 11 | 1100 | 0.5 | $4 \times 10^3$ | 0.12 |
| Examples of the Invention 17 | 13 | 1100 | 0.5 | $4.5 \times 10^3$ | 0.13 |
| Examples of the Invention 18 | 15 | 1100 | 0.5 | $6 \times 10^3$ | 0.13 | out at a relatively high temperature of about 880° C. for a treatment time shorter than 1 hour using wafers having an oxygen concentration of about $13 \times 10^{17}$ atoms/cm$^3$.

As explained hereinabove, the production method according to the present invention which comprises causing wafers to contain a specific concentration of nitrogen and subjecting them to heat treatment and then to epitaxial growth treatment can give epitaxial wafers having an almost constant and high level of gettering effect irrespective of the site of wafer slicing from the single crystal ingot. The method can further suppress the formation of defects in the epitaxial layer.

What is claimed is:

1. A method of producing epitaxial wafers which comprises growing a single crystal silicon ingot while doping with not less than $1 \times 10^{13}$ atoms/cm$^3$ of nitrogen, slicing wafers from the thus-grown single crystal ingot, subjecting the wafers to 15 minutes to 4 hours of heat treatment at a temperature not lower than 700° C. but lower than 900° C. and subjecting the wafer surface after the above heat treatment to epitaxial growth treatment.

2. A method of producing epitaxial wafers as claimed in claim 1, wherein oxygen concentration in the wafers is not less than $11 \times 10^{17}$ atoms/cm$^3$.

3. A method of producing epitaxial wafers as claimed in claim 1, wherein the 15-minutes to 4-hour heat treatment at a temperature not lower than 700° C. but lower than 900° C. is carried out prior to a step of mirror polishing of the wafers.

4. A method of producing epitaxial wafers as claimed in claim 2, wherein the 15-minutes to 4-hour heat treatment at a temperature not lower than 700° C. but lower than 900° C. is carried out prior to a step of mirror polishing of the wafers.

5. A method of producing epitaxial wafers as claimed in claim 1, wherein the heat treatment is carried out in a mixed atmosphere composed of oxygen and an inert gas.

6. A method of producing epitaxial wafers as claimed in claim 2, wherein the heat treatment is carried out in a mixed atmosphere composed of oxygen and an inert gas.

7. A method of producing epitaxial wafers as claimed in claim 3, wherein the heat treatment is carried out in a mixed atmosphere composed of oxygen and an inert gas.

8. A method of producing epitaxial wafers as claimed in claim 4, wherein the heat treatment is carried out in a mixed atmosphere composed of oxygen and an inert gas.

9. A method of producing epitaxial wafers as claimed in claim 1, wherein, in growing the single crystal ingot, a pulling rate is not increased in starting tail formation as compared with the pulling rate of the body.

10. A method of producing epitaxial wafers as claimed in claim 1, wherein, in growing the single crystal ingot, a cooling rate of the body portion from the boundary between the body and tail of the single crystal ingot to 200 mm above the boundary from 1,050° C. to 700° C. is not higher than 2.5° C./minute.

* * * * *

UNITED STATES PATENT AND TRADEMARK OFFICE
CERTIFICATE OF CORRECTION

PATENT NO. : 6,709,957 B2
DATED : March 23, 2004
INVENTOR(S) : Eiichi Asayama et al.

It is certified that error appears in the above-identified patent and that said Letters Patent is hereby corrected as shown below:

Column 6,
Line 67, "2.50/min" should read -- 2.50°C/min --

Column 7,
Line 1, "3.0/min" should read -- 3.0°C/min --

Signed and Sealed this

Twenty-first Day of December, 2004

JON W. DUDAS
*Director of the United States Patent and Trademark Office*